MEANS FOR CONTROLLING BISTABLE TRANSISTOR TRIGGER CIRCUITS

Filed April 26, 1962

INVENTOR
WILHELMUS H.L. CLAESSEN
BY
[signature]
AGENT

3,193,702
MEANS FOR CONTROLLING BISTABLE TRANSISTOR TRIGGER CIRCUITS

Wilhelmus Hubertus Louis Claessen, Eindhoven, Netherlands, assignor to North American Philips Company, Inc., New York, N.Y., a corporation of Delaware Filed Apr. 26, 1962, Ser. No. 190,373
Claims priority, application Germany, May 31, 1961, N 20,125
2 Claims. (Cl. 307—88.5)

Figures 1, 2:
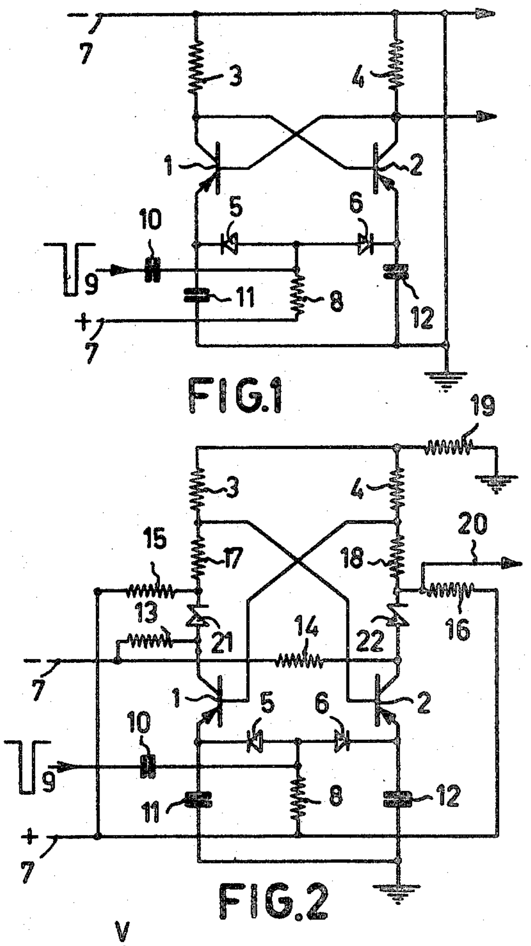

This invention relates to a circuit arrangement for controlling a bistable trigger circuit arrangement having two transistors with cross-coupled base and collector electrodes, particularly for use in a binary counter.

With the increasing development of electronic computers and automation, faster-operating structural units are the ever-present desideratum. One method of approach has been to use the so-called current logic for semi-conductor structural units. In this method the transistors are operated out of saturation and their $\alpha'$-limit frequency lies correspondingly higher; therefore the switching and operating speed of the particular structural unit and, in some cases, of the whole installation, can be increased. Transistor current logic is the subject i.a. of an article by Hannon S. Yourke, published in "I.R.E. Transactions on Circuit Theory" CT–4, Nr. 3 of September 1957 on pages 236–240. In this article, a bistable trigger circuit of the above type suitable for a binary counter is described, among other structural units. However, in a binary counter, two control transistors and a gate circuit with, e.g., two additional transistors for controlling the control transistors are required in addition to the trigger circuit proper.

In U.S. Patent 3,142,764, assigned to the assignee of the instant application, a stage of a binary counter based on the current logic is described. This stage comprises four semi-conductor diodes and a control transistor in addition to the trigger circuit proper; thus, the number of semi-conductor elements is likewise seen to be rather large.

The object of the present invention is to provide a simpler and more economical circuit for controlling a bistable trigger circuit operating with current logic and one which achieves a very high operating speed.

According to one aspect of a circuit arrangement according to the invention, a semi-conductor diode is connected in the forward direction between the emitter of each of the transistors and the corresponding terminal of a source of supply voltage. The source of control voltage pulses is coupled to the common point of these two diodes, in a manner such that reversely-directed voltage steps are thereby set up at this point, and the common point of the emitter of each transistor and its associated diode is by-passed by means of a capacitor which is fully charged only after termination of the recovery time of the diode connected to the other transistor and through the transistor connected to it, if said last transistor was first cut off when a control pulse was received; the capacitor thus maintains said last transistor in the conductive condition during this transition period.

It is noted that it is known from the above mentioned patent to connect a semi-conductor diode in the forward direction between the emitter of each of the transistors of a trigger circuit of the above type and the corresponding terminal of the source of supply current. However, these diodes serve a different purpose in the co-pending application from that of the instant circuit arrangement; in the co-pending application their primary function is to increase the threshold voltage of the transistors by the amount of their own threshold voltage.

In order that the invention may readily be carried into effect, two embodiments thereof will now be described more fully by way of example, with reference to the accompanying diagrammatic drawing, in which FIGURE 1 is a circuit diagram of a simple embodiment of the circuit arrangement according to the invention.

Figure 3:
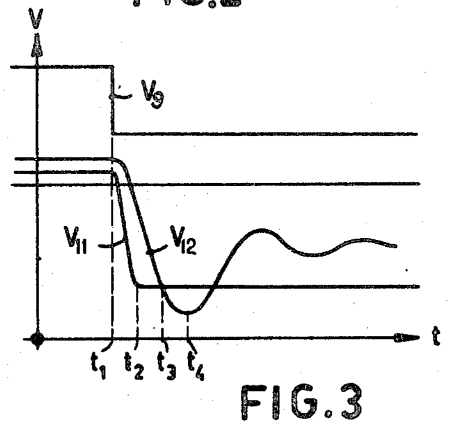

FIGURE 2 is the circuit diagram of an embodiment adapted to the current logic and forming a stage of a binary counter, and FIGURE 3 is a voltage-time diagram illustrating the operation of the embodiment of FIG. 2.

The simple embodiment of the circuit arrangement according to the invention shown in FIGURE 1 comprises two transistors 1 and 2 of the pnp-type, with collector resistors 3 and 4 respectively, the base and collector electrodes being cross-coupled. The emitter electrodes of these transistors are connected to the positive terminal of a voltage source 7 through a common emitter resistor 8 by means of diodes 5 and 6 respectively connected in the forward direction. These diodes may be, for example, semi-conductor germanium diodes. The negative terminal of the voltage source 7 is connected to the collector resistors 3 and 4, and a source of negative control pulses 9 is coupled through a capacitor 10 to the common point of the diodes 5 and 6 and resistor 8. In addition, the common point of the emitter of each of the transistors 1 and 2 and the corresponding diodes 5 and 6 respectively is by-passed by means of capacitors 11 and 12 respectively.

The circuit arrangement shown in a bistable trigger circuit and may form e.g., a stage of a binary counter.

The diagrammatic embodiment shown in FIGURE 2 is adapted to the so-called current logic and also may form a stage of a binary counter. In addition to the elements of the circuit shown in FIGURE 1, which elements are referred to by the same reference numerals in FIGURE 2, this embodiment comprises two Zener diodes 21 and 22 connected respectively in the collector circuits of the transistors 1 or 2. These Zener diodes form sources of negative collector voltage, as a result of which bottoming of the transistors 1 and 2 is avoided. Each of the Zener diodes is connected through resistors 13, 15 and 14, 16 respectively to the negative and positive terminals respectively of the source 7, so that it is always operative in its breakdown range, in which state a constant voltage of e.g., 3 v. is present at its terminals. An additional collector resistor 17 is connected between the common point of the resistor 15 and the diode 21 and the common point of the collector resistor 3 of the transistor 1 and the base of the transistor 2. In the same manner, the collector circuit of the transistor 2 comprises an additional resistor 18, and finally the common point of the collector resistors 3 and 4 is not connected to the negative terminal of the source 7 as was the case in the embodiment shown in FIGURE 1, but to ground, via a common resistor 19. The positive terminal of the source 7 has a potential of, e.g., +24 v. with respect to earth and its negative terminal has a potential of −24 v.

In the embodiment described, the length of a negative control pulse and/or the time constant of the circuit 8, 9, 10 may not exceed a given value. It is assumed that in the initial condition the transistor 1 and the diode 5 associated with it are conductive and that, instead of the negative control pulse indicated in FIGURE 1 or 2, a negative voltage step across the capacitor 10 is set up at the common point of the diodes 5 and 6 and the resistor 8, as shown in FIGURE 3 by the line $V_9$. The voltage across the capacitor 11 then varies from time $t_1$ of the voltage step $V_9$ as indicated by the curve $V_{11}$ in FIGURE 3, while the voltage across the capacitor 12 connected to the emitter of the transistor 2 which was first cut off, varies as shown by the curve $V_{12}$. As may be seen, the voltage $V_{11}$ rather rapidly reaches a minimum value, at time $t_2$, and then remains appoximately constant, the transistor 1 being cut off. As a result of the negative voltage step, the transistor 1 is entirely cut off only at time $t_2$, after the recovery time of the diode 5. The voltage step produced across the resistor 3 by the voltage step across the capacitor 11 is supplied to the base of the transistor 2, so that this transistor becomes simultaneously conductive. During the time elapsing from $t_1$ to $t_2$, both transistors are consequently more or less conductive and the amplification over the closed feedback loop is considerable.

The fact that the emitter of the transistor 2 is connected to ground via the capacitor 12 delays the variation of the emitter potential of this transistor with respect to the variation of its base potential and consequently renders it possible for this transistor to become conductive. The considerable total amplification over the closed feedback loop causes a strong regenerative feedback coupling which cumulatively accelerates the cutting off of the transistor 1 and the onset of conductivity of the transistor 2. As shown in FIGURE 3, the voltage $V_{12}$ across the capacitor 12 follows the voltage $V_{11}$ across the capacitor 11 with some delay and with a somewhat less steep variation, until time $t_3$ at which these two voltages become equal to one another. From time $t_2$ onwards, both diode 5 and 6 are biased in the reverse direction and entirely cut off, since the recovery time of the diode 5 which was first conductive is now completed. The voltage across the capacitor 12 varies according to a damped oscillation since the transistor 2, from the instant at which it becomes somewhat conductive, may for some time be considered as an emitter amplifier with an exclusively capacitive emitter load.

As can be seen from FIG. 3, after time $t_3$ the voltage $V_{12}$ becomes smaller than the voltage $V_{11}$ which is now substantially constant; the voltage $V_{12}$ reaches a minimum value at time $t_4$, then increases again etc. If the pulse across the resistor 8 terminates only after time $t_3$, the possibility consequently exists for the transistor 1 to to be ultimately blocked again and for the transistor 2 to return to its initial condition. The half cycle $\Delta t = t_1$ to $t_4$ is a function of the $\alpha'$-limit frequency of the transistor 2 and of the internal base resistance of this transistor, of the resistor connected in its base circuit (substantially equal to the parallel combination of the resistors 3 and 17) and of the capacity of the capacitor 12. At time $t_3$ the emitter of the transistor 2 becomes negative with respect to the emitter of the transistor 1 and at time $t_4$ its emitter current becomes zero, so that the differenial of the collector current with respect to time has to change its sign before time $t_4$. A cumulative change of condition of the two transistors and of the circuit arrangement therefore must take place between times $t_2$ and $t_3$. Before this change can take place, the voltage across the resistor 8 must therefore return to its original value, whereby a positive voltage step is set up at the anodes of the diodes 5 and 6. If this occurs between times $t_2$ and and $t_3$, the current through the diode 5 is larger than or equal to the current through the diode 6, both capacitors 11 and 12 are charged to the same voltage and the just reached new stable state of the circuit arrangement is maintained. The new stable condition of the circuit arrangement is likewise also not changed if the voltage pulse does not return to zero before time $t_3$ but the capacitor 10 is charged again by the current through the resistor 8 before the time $t_3$ and to such an extent that the two diodes 5 and 6, or at least the diode 6, are biased in the forward direction by the voltage across this capacitor.

From the above considerations it may be concluded that the control of the circuit shown in FIGS. 1 and 2 can theoretically be made independent of the pulse length by suitable choice of the ratio of the current through the resistor 8 to the capacity of the coupling capacitor 10, and thus finally by a suitable maximum value of this capacity. It will be appreciated however that in practice the control voltage is not, as was assumed, a voltage step, so that also a minimum valve of the capacity of the capacitor 10 is necessary which value has to take into account the rise time and the amplitude of the input voltage step, the value of the voltage variation at the emitter of the conductive transistor necessary to effect the cumulative switching of the trigger circuit arrangement, and in addition the material resistance and the recovery time of the diodes 5 and 6. The capacitor 10 must however be chosen to have a maximum value such that after receiving a reversely-directed voltage step (in this case a negative voltage step) it is charged again by the source of supply voltage (7, 8) before the voltage across the capacitor 12 connected to the emitter of the originally cut off transistor 2 becomes as large as the voltage across the other emitter capacitor (11).

The resistor 19 of the embodiment shown in FIGURE 2 decreases the regenerative feedback coupling via the two transistors, so that the output pulse at the terminal 20 is somewhat smoothed thereby. Otherwise, this pulse would indeed have a sharp high peak followed by a flat top, which would be disadvantageous for many uses.

By connecting the Zener diodes 21 and 22 in the circuit arrangement, the base voltage of each of the transistors 1 and 2 remains positive with respect to the collector of that transistor, so that even under strongly conductive conditions the conductive transistor operates very much above the knee of its collector voltage-collector current characteristic and no accumulation of free charge carriers of a consequence can take place in the conductive transistor. At the output terminal 20, e.g. at the common point at the diode 12 and of the resistors 16 and 18, somewhat smaller voltage steps are then set up which, however, have a substantially constant amplitude and are suitable for the so-called current logic. The part of the voltage source 7 operative between the resistor 8 and ground forms, together with the resistor 8, a current source which can be connected to the output terminal (e.g. 20) via the transistor 1 or 2 and the corresponding diodes 5, 21 and 6, 22, respectively.

In a practical embodiment of the circuit arrangement shown in FIGURE 2, the various elements were as follows:

Transistors 1 and 2 of the type OC170
Diodes 5 and 6 of the type OA90
Diodes 21 and 22 of the type OAZ203
Capacitors 11 and 12 of 100 pf.
Capacitor 10 of 180 pf.
Resistors 3 and 4 of 150 ohm.
Resistors 13 and 14 of 2.2K ohm
Resistors 15 and 16 of 4.7K ohm
Resistors 17 and 18 of 150 ohm
Resistor 8 of 4.7K ohm, and
Resistor 19 of 100 ohm.

Within an input voltage step of 1 v. with a rise time of 5 sec.$^{-9}$, this circuit could be effectively controlled with a pulse duration of from 30 to 50 sec.$^{-9}$, and any variations of the voltages at the two terminals of the source 7 with respect to ground up to approximately 20% influence the operation of the circuit. It should be emphasized in this connection that the diodes used as diodes 5 and 6 were not the so-called "rapid" (and costly) diodes; rather, they were diodes in which a considerable accumulation of free charge carriers can easily take place. However, in the circuits described, this accumulation is not a drawback since it benefits and accelerates the discharge of the by-passing capacitor connected to the emitter of the transistor which was first conductive.

While the invention has been described with respect to specific embodiments, various changes and modifications thereof will be readily apparent to those skilled in the art without departing from the inventive concept, the scope of which is set forth in the appended claims. It is also to be understood that the various quantitative values given are illustrative only and are provided only to enable ready practice of the invention.

What is claimed is:

1. A control circuit for a bistable trigger comprising: a bistable trigger circuit having two transistors, each of said transistors having base, emitter and collector electrodes, the base and collector electrodes of said two transistors being cross-coupled, a source of supply voltage, two semi-condoctor diodes each being connected in the forward direction between the emitter electrode of one of said transistors and a common point, a resistor connected between said common point and a terminal of said source having a potential which is forward directed with respect to said diodes and emitter electrodes, each diode having a recovery time, two capacitors each being connected between the junction point of the emitter electrode of one of said transistors and its associated diode and a point of constant potential, and a source of input control voltage pulses coupled across said resistor through a third capacitor, each input pulse setting up a reversely directed voltage step at said common point, each of said two capacitors having a valve such that the one of said two capacitors connected to the emitter electrode of the one of said transistors which was cut off prior to the application of a particular voltage pulse is fully charged through said transistor and upon application of said particular voltage pulse after termination of the recovery time of the diode which is connected to the emitter-electrode of the other transistor, said one capacitor acting to maintain said one transistor in the conductive condition until after the termination of the recover time of the diode connected to the emitter electrode of said other transistor.

2 A control circuit for a bistable trigger comprising: a bistable trigger circuit having two transistors, each of said transistors having base, emitter and collector electrodes, the base and collector electrodes of said two transistors being cross-coupled, a source of supply voltage, two semiconductor diodes each being connected in the forward direction between the emitter electrode of one of said transistors and a common point, a resistor connected between said common point and a terminal of said source having a potential which is forward directed with respect to said diodes and emitter electrodes, each diode having a recovery time, two capacitors each being connected between the junction point of the emitter electrode of one of said transistors and its associated diode and a point of constant potential, and a source of input control voltage pulses coupled across said resistor through a third capacitor, each input pulse setting up a reversely directed voltage step at said common point, each of said two capacitors having a value such that the one of said two capacitors connected to the emitter electrode of the one of said transistors which was cut off prior to the application of a particular voltage pulse is fully charged through said transistor and upon application of said particular voltage pulse after termination of the recovery time of the diode which is connected to the emitter-electrode of the other transistor, said one capacitor acting to maintain said one transistor in the conductive condition until after the termination of the recovery time of the diode connected to the emitter electrode of said other transistor, said third capacitor having a value such that it is re-charged by said source before the voltage of said one capacitor becomes as large as the voltage across the other capacitor.

References Cited by the Examiner

UNITED STATES PATENTS

| | | | |
|---|---|---|---|
| 2,921,192 | 1/60 | Casey et al. | 307—88.5 X |
| 3,076,105 | 1/63 | Robinson et al. | 307—88.5 |

JOHN W. HUCKERT, *Primary Examiner*.

ARTHUR GAUSS, *Examiner*.

UNITED STATES PATENT OFFICE
CERTIFICATE OF CORRECTION

Patent No. 3,193,702 July 6, 1965

Wilhelmus Hubertus Louis Claessen

It is hereby certified that error appears in the above numbered patent requiring correction and that the said Letters Patent should read as corrected below.

Column 2, line 27, for "in" read -- is --; line 36, for "or" read -- and --; line 54, for "earth" read -- ground --; column 3, line 75, for "valve" read -- value --; column 4, line 16, after "decreases" insert -- to some extent --; line 27, for "a" read -- any --; line 54, for "Within" read -- With --; line 58, after "20%" insert -- did not --; column 5, line 7, for "semi-condoctor" read -- semi-conductor --.

Signed and sealed this 20th day of September 1966.

(SEAL)
Attest:

ERNEST W. SWIDER
Attesting Officer

EDWARD J. BRENNER
Commissioner of Patents